United States Patent [19]

Niiranen

[11] Patent Number: 4,977,383
[45] Date of Patent: Dec. 11, 1990

[54] RESONATOR STRUCTURE

[75] Inventor: Erkki O. Niiranen, SF-91100-Ii, Finland

[73] Assignee: LK-Products Oy, Kempele, Finland

[21] Appl. No.: 421,360

[22] Filed: Oct. 13, 1989

[30] Foreign Application Priority Data

Oct. 27, 1988 [FI] Finland .................................. 884953

[51] Int. Cl.⁵ .............................................. H01P 7/00
[52] U.S. Cl. .................................... 333/219; 333/202; 333/204
[58] Field of Search ............... 333/202, 204, 207, 219, 333/222, 223, 224, 235, 246; 336/199, 192, 200, 205, 208

[56] References Cited

U.S. PATENT DOCUMENTS

| | | | |
|---|---|---|---|
| 3,621,484 | 11/1971 | Shult | 333/202 |
| 3,820,045 | 6/1974 | Igarashi | 333/185 |
| 3,936,776 | 2/1976 | Sundquist | 333/202 |
| 4,035,695 | 7/1977 | Knutson et al. | 333/185 X |
| 4,422,058 | 12/1983 | Vizmuller | 333/202 |
| 4,682,131 | 7/1987 | May | 333/202 |
| 4,860,433 | 8/1989 | Miura | 336/200 X |

FOREIGN PATENT DOCUMENTS

| | | | |
|---|---|---|---|
| 0024201 | 2/1983 | Japan | 333/219 |
| 8905046 | 6/1989 | PCT Int'l Appl. | 333/222 |

Primary Examiner—Eugene R. LaRoche
Assistant Examiner—Seung Ham
Attorney, Agent, or Firm—Lyon & Lyon

[57] ABSTRACT

The invention relates to a resonator structure comprising a printed board of an insulating material; a helix resonator mounted on the printed board, the helix resonator being formed by a wire wound into a cylindrical coil with a number of turns, one of the turns comprising a straight portion bent in parallel with the surface of the printed board; and a casing surrounding the helix resonator and having at least an inner and outer surface made of an electrically conductive material. In order to improve the reproduction fidelity of the matching of the helix resonator in series production, the resonator structure according to the invention is characterized in that a micro strip conductor is provided on the surface of the printed board, the microstrip being electrically connected to a predetermined position on said straight portion.

10 Claims, 1 Drawing Sheet 4,977,383

RESONATOR STRUCTURE

FIELD OF THE INVENTION

The invention relates to resonator structures and filter circuits employing helix resonators.

BACKGROUND OF THE INVENTION

A helix resonator, known as a helix, is a quarter-wave transmission line resonator (electrical length about a quarter of a wavelength). The resonator is formed by a round or profiled wire wound into a cylindrical coil. The helix resonator is placed in a casing made of a highly conductive material and forming the ground plane, and one end of the helix is left open. The specific impedance of the helix resonator is determined by the ratio of the diameter of the coil to the inner dimension of the surrounding casing, the distance between adjacent turns in the coil, i.e., pitch, and the properties of the plastic or printed board material supporting the resonator.

The helix resonator is considerably smaller than so called coaxial resonators having similar properties, which is a factor of great importance in high-frequency radio devices By cascading several such resonators, a small high-frequency filter with good properties is obtained for use especially in portable and cellular radiotelephone devices. The rapid decrease in the size of such radio devices has created a demand for considerably smaller filters Decreased filter sizes, in turn, require greater accuracy in the production and assembly of high-frequency components.

In filter structures, the helix resonator has to be connected to a generator exhibiting a predetermined specific impedance or to a similar signal producing device and to other helix resonators in the filter circuit. Thereby the coupling between the generator and the resonator, for instance, has to be such that their impedances match in order to prevent mismatch losses in signal transmission. A suitable impedance level has to be found in the helix resonator, that is, a physical point of connection at which the impedance level of the resonator equals that of the device connected thereto. This is because the impedance level of the helix resonator is directly proportional to its electrical length, whereby a lower or higher helix resonator impedance level can be selected by moving the point of connection along the resonator. This kind of matching may be called "tapping" because the point of connection forms a tap point from the helix resonator. The tap or connection point in the helix resonator can be determined by experimentation or by calculation using a calculated or measured specific impedance of the helix resonator. In many cases, the tap point in the helix resonator is made in its first turn. Traditionally, tapping has been made by soldering or welding one end of a separate coil to the wire forming the helix resonator at the tap point. With decreasing filter sizes, the reproduction fidelity has been found to be inadequate for series production. Inadequate accuracy in tapping results in a need for adjusting the tapping when tuning the filters, which increases tuning time and costs.

SUMMARY OF THE INVENTION

The object of the present invention is to provide a helix resonator structure by means of which tapping in series production filters can be made simply and accurately.

This is achieved by means of a resonator structure comprising a printed board of an insulating material; a helix resonator mounted on the printed board, the helix resonator being formed by a wire wound into a cylindrical coil with a number of turns, one of the turns comprising a straight portion bent in parallel with the surface of the printed board; and a casing surrounding the helix resonator and having at least the inner and outer surface made of an electrically conductive material, and a micro strip provided on the surface of the printed board, the microstrip being electrically connected to a predetermined position on said straight portion.

Since a portion of the resonator is bent in parallel with the surface of the printed board, a microstrip on the printed board is connected to the desired tap point in the helix resonator by any suitable technique so as to form a galvanic, capacitive or inductive coupling or their combination between the microstrip and the tap point of the helix resonator. By moving the microstrip along the straight portion of the selected turn of the helix resonator, the position of the tap point can be easily changed, as desired. Change in the position of the microstrip requires etching of a new printed board in which the tap point is in the new position. After the correct position of the microstrip on the printed board has been found, printed boards of this type only are used in subsequent series production so that the tap point will be automatically correct. The formation of the microstrip on the printed board and, as a consequence, the tapping made by it, is highly reproducible and thus very suitable for large-scale series production. Possible subsequent changes in the positions of tap points are easy and rapid to make by means of a few printed boards made for testing purposes without having to construct any new expensive auxiliary means.

In one embodiment of the invention, the helix resonator is laid on the printed board with said straight portion against the surface of the printed board. Thereby the correct tap point can be found also by moving the helix resonator with respect to the microstrip disposed on the printed board.

In another embodiment of the invention, the helix resonator is always placed in the same position around the projection of the printed board, whereby the tap point is determined solely on the basis of the position of the microstrip etched on the printed board.

The structure of the invention also enables the tap connection to be soldered simultaneously with the soldering of the other components on the printed board.

BRIEF DESCRIPTION OF THE DRAWINGS

The invention will now be described in greater detail by means of embodiments with reference to the attached drawing, wherein.

DESCRIPTION OF ILLUSTRATIVE EMBODIMENTS

Figure 1A:
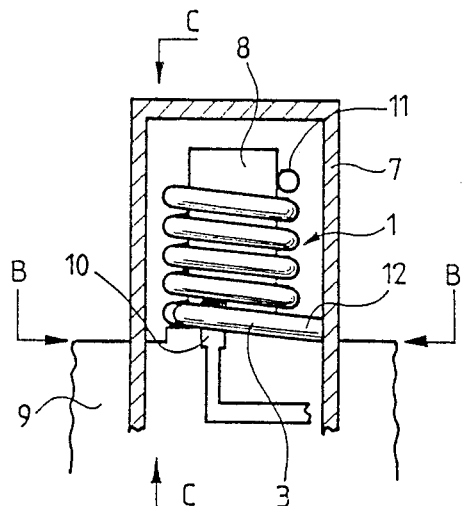
FIG. 1A shows a partial sectional plane view of a resonator structure according to the invention.
Figure 1B:
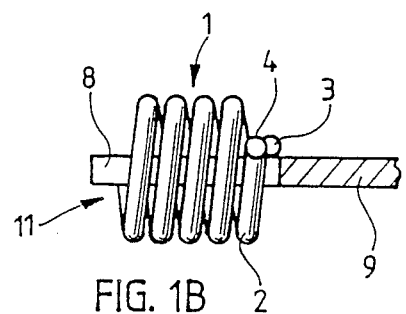
FIG. 1B shows a sectional side view of the resonator structure of FIG. 1A as taken along the line C-C.
Figure 1C:
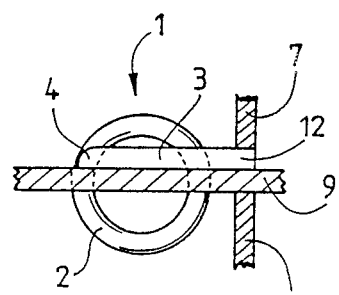
FIG. 1C shows a sectional view of the resonator structure of FIG. 1A as taken along the line B—B.

To begin with, FIG. 1A-1C will be referred to. A projection or arm 8 projects from the edge of a printed board 9 (shown only partially) made of an insulating material A helix resonator 1 is placed around the projection 8 so that the projection is wholly positioned within the helix resonator 1, thus supporting it. The resonator 1 is formed by a wire wound into a cylindrical coil with a number of turns. The width of the projection 8 of the printed board 9 is preferably equal to the inner diameter of the coil 1 and its length is equal to that of the coil 1, whereby the coil 1 is steadily fixed in position.

The end portion of a selected turn 2 (in this case, the first turn) at the end of the helix resonator or coil 1 close to the printed board 9 is bent so as to form a straight portion 3 substantially parallel with the diameter of the coil 1 and the surface of the printed board 9. The straight portion 3 is preferably positioned against the surface of the printed board 9 over it entire length. This straight portion 3 of the first turn 2 extends from a bending point 4 across the first end of the coil 1 and comprises an extension 12 extending outside the cross-sectional contours of the coil 1. A casing 7 of electrically conductive material, preferably metal, is arranged to surround the helix resonator or coil 1 apart from it. One end of the casing 7 is provided with a slit by means of which the casing is attached to the printed board 9. The slit may be so dimensioned that when the casing 7 is pushed on to the printed board, the projection 12 is clamped between the casing 7 and the printed board 9. This ensures that the helix resonator 1 is steadily fixed in position and improves its cooling by making the transfer of heat from the coil 1 to the casing 7 more efficient.

A microstrip 10 is provided on the printed board 9 at the foot of the projection 8 below the straight portion 3 of the coil 1. The microstrip is connected to another resonator circuit and/or forms part of a more extensive microstrip pattern on the printed board. In this specific case, the microstrip 10 runs transverse to the straight portion 3; however, it may also run in some other direction with respect to the straight portion. Matching with the resonator 1 can be affected also by varying the width of the microstrip 10.

The desired impedance is selected by means of the position of the tap or connection point of the microstrip 10 on the straight portion 3 of the coil 1. In FIG. 1A, the desired impedance level in the helix resonator can be selected by moving the microstrip 10 to the left or to the right in the direction of the straight portion 3. The correct impedance or matching level can be found by trying various printed boards 9 in which the microstrip 10 is positioned at different points. After the correct position of the microstrip 10 on the printed board 9 has been found, the printed board can be used in series production, the helix resonator 1 and the casing 7 being attached to it. The coupling between the helix resonator 1 and the microstrip 1 can be made by any suitable technique, such as soldering in the case of galvanic coupling. The soldering can be carried out simultaneously with the soldering of the other components on the printed board.

Even though the projection 8 of the printed board in FIGS. 1A-1C clearly protrudes from the edge of the printed board 9 and is integral with it, the projection 8 can also be formed by a separate part attached to the edge of the printed board and/or it can be shaped so that it remains within the contours of the printed board 9. For example, this could be effected by forming two parallel slits in the edge of the printed board, so that a branch corresponding to the projection 8 would be defined therebetween.

One and the same printed board may comprise several projections 8, whereby a helix resonator 1 is placed in each one of them. The helix resonators can thereby be connected to form an integral filter by means of a microstrip pattern on the printed board.

The model of the helix resonator 1 shown in FIGS. 1A-1C enables the use of very low tap points, which has not been realizable in any practical way previously.

Figure 2A:
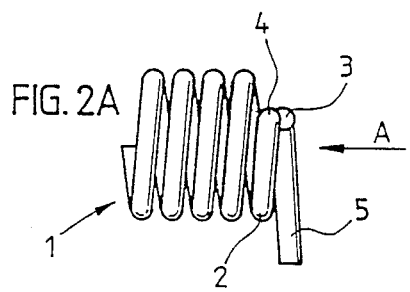
FIGS. 2A and 2B are a side view and an end view, respectively, of another helix resonator according to the invention.
Figure 2B:
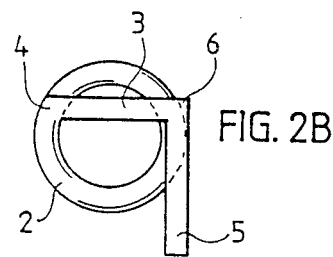

FIGS. 2A-2B show another model of the helix resonator 1. This model comprises two bendings, which enables the use of higher tap points. In FIGS. 2A-2B, the selected turn 2 of the coil 1 (in this case, the first turn) again comprises the straight portion 3 which is bent inwardly substantially in parallel with the diameter of the coil and which runs from the bending point 4 across the end of the coil 1. On the other side of the coil 1, the wire is bent so as to form an extension 5 projecting substantially perpendicularly downward beyond the cross-sectional contours of the coil.

Figure 3A:
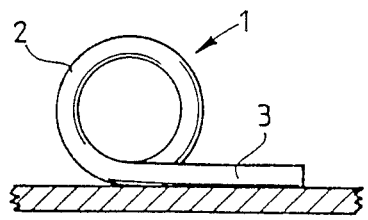
FIGS. 3A and 3B are a side view and an end view, respectively, of still another helix resonator according to the invention, which resonator is intended to be placed on the surface of a printed board.
Figure 3B:
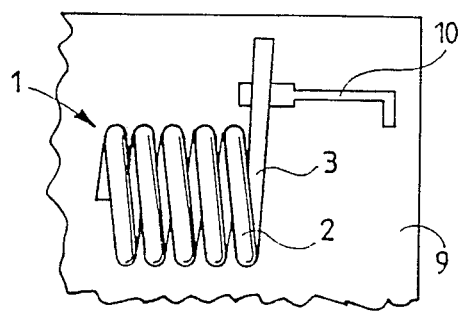

FIGS. 3A and 3B show still another model of the helix resonator 1, intended to be placed on the surface of the printed board 9. In FIGS. 3A and 3B, the selected turn 2 of the helix resonator 1 (in this case, the first turn) is bent tangentially to form a straight portion 3 extending beyond the cross-sectional contours of the helix resonator. The helix resonator 1 is mounted on the printed board 9 so that the straight portion 3 is positioned against the surface of the printed board and on a microstrip 10 positioned on the printed board. The correct tap point can now be found by moving either the helix resonator 1 or the microstrip 10 positioned on the printed board.

The figures and the description related thereto are only intended to illustrate the present invention. In its details, the invention may vary within the scope of the attached claims.

I claim:

1. A resonator structure comprising:
    a printed board of an insulating material;
    a helix resonator mounted on the printed board, the helix resonator being formed by a wire wound into a cylindrical coil with a number of turns, one of the turns comprising a straight portion bent in parallel with the surface of the printed board;
    a casing surrounding the helix resonator and having at least the inner and outer surface made of an electrically conductive material, and
    a micro strip provided on the surface of the printed board, said coil straight portion and said micro strip being selectively placed in mutual engagement and electrically connected at a predetermined position along said straight portion to form a tapping point whereby said micro strip will automatically provide an accurate predetermined tapping of the helix resonator by means of the electrical connection when the helix resonator is mounted on the printed board in a fixed position.

2. A resonator structure according to claim 1, wherein said microstrip is in galvanic contact with the straight portion of the helix resonator.

3. A resonator structure according to claim 1, wherein the helix resonator is placed on the surface of the printed board with said straight portion against the surface of the printed board.

4. A resonator structure according to claim 1, wherein said straight portion extends tangentially beyond the cross-sectional extent of the coil of the helix resonator.

5. A resonator structure comprising
a printed board of an insulating material;
a projection formed on the edge of the printed board;
a helix resonator mounted on the printed board to surround said projection, the helix resonator being formed by a wire wound into a cylindrical coil with a number of turns, one of the turns comprising a straight portion bent inwardly substantially in parallel with the diameter of the resonator and the surface of the printed board;
a casing surrounding the helix resonator and having at least the inner and outer surface made of an electrically conductive material, and
a micro strip provided on the surface of the printed board, the microstrip being electrically connected to a predetermined position on said straight portion.

6. A resonator structure according to claim 5, wherein said microstrip is in galvanic contact with the straight portion of the helix resonator.

7. A resonator structure according to claim 5, wherein the straight portion extends from the bending point across the first end of the helix resonator and comprises an extension extending beyond the cross-sectional extent of the coil of the helix resonator.

8. A resonator structure according to claim 5, wherein the straight portion extends from the bending point across the first end of the helix resonator and comprises an extension bent towards the surface of the printed board and running beyond the cross-sectional contours of the helix resonator.

9. A resonator structure according to claim 7, wherein said extension is attached to a casing surrounding the helix resonator.

10. A resonator structure according to claim 5, wherein the width of the projection in the printed board is substantially equal to the inner diameter of the helix resonator.

* * * * *